United States Patent [19]

Liu

[11] Patent Number: 5,600,288
[45] Date of Patent: Feb. 4, 1997

[54] SYNTHETIC INDUCTOR IN INTEGRATED CIRCUITS FOR SMALL SIGNAL PROCESSING

[75] Inventor: Jing-Meng Liu, Hsinchu, Taiwan

[73] Assignee: Tainan Semiconductor Manufacturing Company, Ltd., Hsinchu, Taiwan

[21] Appl. No.: 613,575

[22] Filed: Mar. 11, 1996

[51] Int. Cl.[6] .................................................. H03H 11/48
[52] U.S. Cl. ........................................ 333/214; 327/552
[58] Field of Search ..................................... 333/214, 215

[56] References Cited

U.S. PATENT DOCUMENTS 3,448,411  6/1969  Patterson .................... 333/214
3,585,539  6/1971  Rao ............................ 333/215
3,835,399  9/1974  Holmes ....................... 327/555
5,093,642  3/1992  Mittel ......................... 333/215
5,202,655  4/1993  Hara .......................... 333/215
5,235,223  8/1993  Maple ........................ 327/556

*Primary Examiner*—Paul Gensler
*Attorney, Agent, or Firm*—George O. Saile

[57] ABSTRACT

An equivalent circuit for a synthetic inductor is disclosed. The circuit in this invention utilizes a plurality of N-channel and P-channel FET devices, resistors and capacitors that can be easily fabricated using standard integrated circuit processing. The inductances that can be fabricated are on the order of 100 μH to 100 mH with a frequency response achievable to greater than 10 Mhz.

15 Claims, 6 Drawing Sheets

SYNTHETIC INDUCTOR IN INTEGRATED CIRCUITS FOR SMALL SIGNAL PROCESSING

BACKGROUND OF INVENTION

1. Field of Invention

This invention relates to the circuits used to simulate the electrical characteristics of an inductor and in particular those circuits that can be easily fabricated using standard integrated circuits processing techniques.

2. Description of Related Art

The design of electrical filters and similar applications require the 5 use of resistors (R), capacitors (C), and inductors (L). Practical inductors can not be implemented easily on integrated circuits. The use of passive resistors/capacitors (RC) networks while practical, occupy a relatively large amount of space if implemented in integrated circuits. The RC networks generally are limited to simple applications where a low quality factor (Q) is acceptable.

Active filters incorporating operational amplifiers have very powerful applications since almost any frequency transfer function can be implemented. The bandwidth of these applications, however, will generally be limited to lower frequencies such as in the audio band because of the limited bandwidth of most operational amplifiers.

In FIG. 1A a typical simple series RLC filter is illustrated. The voltage source $V_{in}$ provides a voltage that is:

$$V_{in} = V_{max} \sin(\omega t).$$

where $V_{max}$ is the maximum value of the voltage of the source;

$\omega$ is the frequency of the signal in radians per second;

t is the time from the application of the voltage source in seconds.

The characteristic of an inductor is that current through the inductor is delayed by $\pi/2$ radian in phase from the voltage applied to its terminals, the impedance $Z_L$ of the inductor L is:

$$Z_L = j\omega \iota_L$$

where $$j = \sqrt{-1}.$$

$\omega$ is the frequency of the signal in radians per second.

$\iota_L$ is the value of the inductance of the inductor L in henries.

The impedance $Z_R$ of the resistor R is:

$$Z_R = r_R$$

where $r_R$ is the value of the resistor R in ohms ($\Omega$).

The impedance $Z_c$ of the Capacitor C is:

$$Z_C = \frac{1}{j\omega C_C}$$

where $$j = \sqrt{-1} \; ;$$

$\omega$ is the frequency of the signal in radians per second;

$C_c$ is the value of the capacitance of the capacitor C in Farads.

The current i through the network formed by the inductor L, Resistor R, and the Capacitor C is:

$$i = \frac{V_{in}}{Z_L + Z_R + Z_C}$$

and the voltage $V_{out}$ is:

$$V_{out} = iZ_C$$

$$V_{out} = V_{in}\left(\frac{Z_C}{Z_L + Z_R + Z_C}\right)$$

$$V_{out} = V_{in}\left(\frac{1}{-\omega^2 \iota_L C_C + j\omega r_R C_C + 1}\right)$$

FIG. 2 is a plot of the gain (5 $V^{at}/V_{in}$) of the circuit of FIG. 1A as a function of the frequency (Hz) of the voltage source $V_{in}$ as expressed in decibels (db). Because of nonidealities in the construction of an inductor, a pure inductance is impossible to achieve. A physical inductor is an ideal inductor in series with a resistor. Theoretically the series resistance can be further reduced with advanced IC processing and further circuit optimization.

U.S. Pat. No. 3,448,411 (M. Patterson) teaches a circuit for simulating the electrical characteristics of air core and iron core inductance coils. U.S. Pat. No. 5,093,642 (Mittel) describes a solid state mutually coupled inductor.

U.S. Pat. No. 3,835,399 (R. Holmes) demonstrates a network of operational amplifiers coupled to simulate an inductor.

U.S. Pat. No. 5,235,223 (C. Maple) describes a tunable circuit using synthetic inductors and capacitor multipliers in place of discrete inductive and capacitive elements.

SUMMARY OF THE INVENTION

An object of the invention is to provide an equivalent circuit for an inductor that is easily implemented on integrated circuits with efficient use of space. Another object of this invention is to provide a simulated inductor that can replicate the frequency response of an inductor over a wide bandwidth. The schematic circuit for a wideband inductor, as shown in FIG. 4, consists of a first and second P-channel Field Effect Transistor (FET) $M_1$ and $M_2$ connected in o such a fashion that the current through the drains of each P-channel FET tracks each other; a first N-Channel FET $M_7$ and a third P-Channel FET $M_8$ that has a resistor R connected between the sources; a second N-channel FET $M_6$ that has its drain connected to the gate of the first N-Channel FET $M_7$ and to a first connection terminal A; a third N-Channel FET $M_k$ that has its gate connected to the drain of the second P-Channel FET $M_2$, a current source $I_s$, and a first terminal of a capacitor $C_i$; a dc voltage source $V_c$ coupled between the gate of the second N-Channel FET $M_6$ and ground. The second terminal B is connected to the gate of the third P-channel FET $M_8$.

Other objects, features, and advantages of the invention will become evident from the following detailed description of the invention when considered in conjunction with the accompanying drawings.

DETAILED DESCRIPTION OF THE INVENTION

Figure 3:
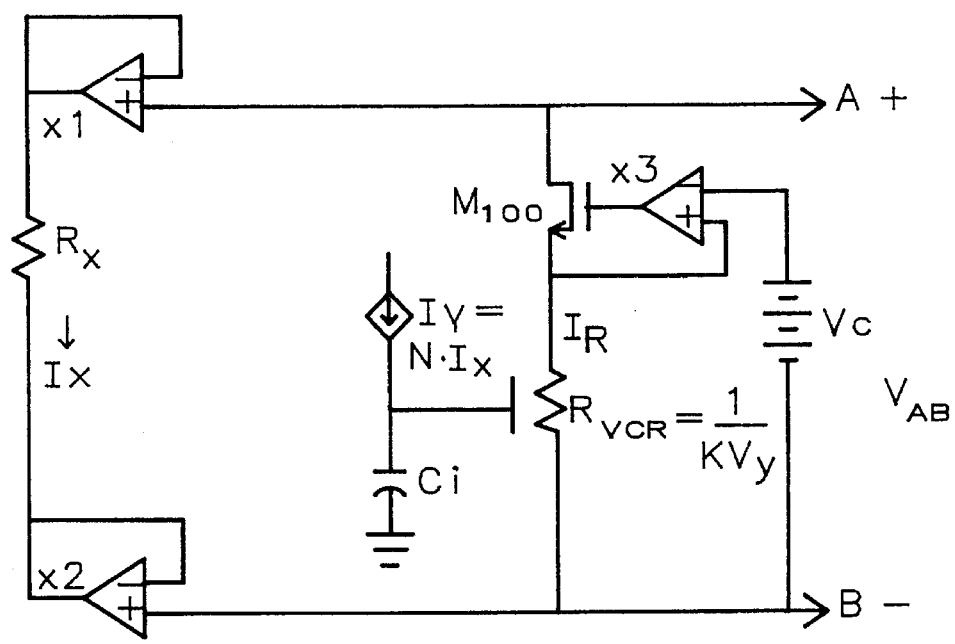
FIG. 3 is an equivalent circuit diagram of this invention.

FIG. 3 is an equivalent circuit diagram of the synthetic inductor. Terminal A and terminal B are the input terminals of the circuit that will couple to terminals A and B of FIG. 1B. Terminal A is connected to the positive terminal of buffer amplifier $X_1$ and terminal B is connected to the positive terminal of buffer amplifier $X_2$. The buffer amplifiers $X_1$ and $X_2$ generate a current $I_X$ through resistor $R_X$. Since buffer amplifiers $X_1$ and $X_2$ have unity gain, the current $$I_X = \frac{V_{AB}}{R_X} .$$

The linear current controlled current source $I_y$ will source current that is:

$$I_y = N \cdot I_x$$

where N is the constant multiplier factor of the current source $I_y$.

The current source $I_y$ sources its current into capacitor $C_i$ to develop a voltage across capacitor $C_i$ that is $V_Y$. The voltage $$V_Y = \frac{I_Y}{Z_{C_i}}$$

where $Z_{Ci}$ is the impedance of capacitor Ci which is $$Z_{C_i} = \frac{1}{j\omega C_i} .$$

The AC component of $V_Y$, which is $\hat{v}y$, is $$\hat{v}_y = \frac{\hat{i}_y}{sC_i} = \frac{N\hat{v}_{AB}}{sC_iR_X}$$

where s=jω

$\hat{V}_{AB}$ is the AC component of $V_{AB}$.

The voltage supply $V_c$ is coupled to operational amplifier $X_3$. Operational amplifier $X_3$ is configured with N-channel FET $M_{100}$ such that it will provide the constant voltage $V_c$ to the source of N-channel FET $M_{100}$. The drain of $M_{100}$ is coupled to the input terminal A. The voltage controlled resistor $R_{VCR}$ is connected between the source of the N-channel FET $M_{100}$ and the input terminal B. The resistance of the voltage controlled resistor $R_{VCR}$ is $$R_{VCR} = \frac{1}{KV_Y}$$

where K is a constant multiplier of the resistance.

Since the source of the N-channel FET $M_{100}$ is always at the voltage $V_c$, the current $I_R$ is:

$$I_R = \frac{V_C}{R_{VCR}}$$

with the AC component being:

$$\hat{i}_R = \frac{V_C}{r_{VCR}} = \frac{V_C}{\frac{1}{KV_Y}}$$

$$\hat{i}_R = \frac{V_C N K \hat{v}_{AB}}{sC_iR_X} .$$

Since $$Z_{AB} = \frac{\hat{v}_{AB}}{\hat{i}_R} = \frac{sC_iR_X}{V_CNK} = sL_{AB}, \text{ then } L_{AB} = \frac{C_iR_X}{V_CNK} .$$

Figure 4:
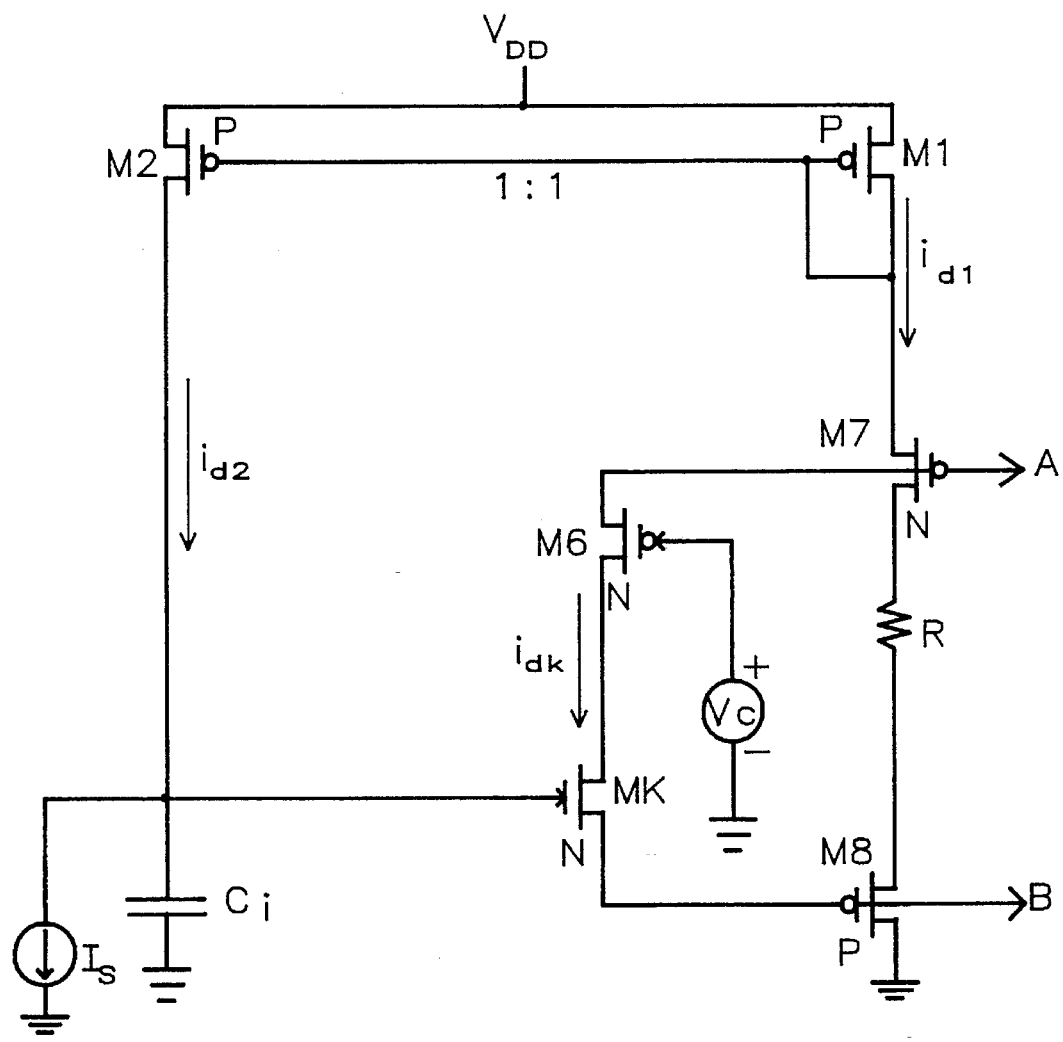
FIG. 4 is a schematic drawing of an embodiment of this invention.

In FIG. 4 a circuit schematic of the preferred embodiment of this invention is shown. The currents $I_{d1}$ and $I_{d2}$ are equal and $$I_{d1} = \frac{V_{AB} - V_{gs7} - V_{gs8}}{R}$$

where $V_{AB}$ is the voltage developed from the first connection terminal A and the second connection terminal B;

$V_{gs7}$ is the voltage developed from the gate to the source of the N-Channel FET $M_7$;

$kV_{gs8}$ is the voltage developed from the gate to the source of the P-Channel FET $M_8$.

Each current $I_x$ in this schematic is composed of two components, a DC component $\bar{I}_x$ and an AC component $\hat{i}_x$ where:

$$I_x = \bar{I}_x + \hat{i}_x$$

Also, each voltage $V_x$ in this schematic is composed of two components, a DC component $\bar{V}_x$ and an AC component $\hat{v}_x$ where $$V_x = \bar{V}_x + \hat{v}_x$$

From the above, then $$I_{d1} = \bar{I}_{d1} + \hat{i}_{d1} = \frac{\left( \bar{V}_{AB} - \bar{V}_{gs7} - \bar{V}_{gs8} + \hat{v}_{AB} - \frac{\hat{i}_{d7}}{g_{m7}} - \frac{\hat{i}_{d8}}{g_{m8}} \right)}{R}$$

where $\hat{i}_{d1} = \hat{i}_{d7} = \hat{i}_{d8}$;

$\hat{i}_{d7}$ is the AC component of the drain current of $M_7$;

$\hat{i}_{d8}$ is the AC component of the drain current of $m_8$;

$\bar{I}_{d1}$ is the DC component of $I_{d1}$;

$\hat{i}_{d1}$ is the AC component of $I_{d1}$;

$\bar{V}_{gs7}$ is the DC component of the gate to source voltage of N-Channel FET M7;

$\bar{V}_{gs8}$ is the DC component of the gate to source voltage of P-Channel FET M8;

gm7 is the small signal transconductance of N-Channel FET M7;

gm8 is the small signal transconductance of P-Channel FET M8.

Solving for $\hat{i}_{d1}$:

$$\hat{i}_{d1} = \frac{1}{(1+X)R} \hat{v}_{ab}$$

where $$X = \frac{1}{gm_7 R} + \frac{1}{gm_8 R}$$

The DC component of the current source $I_s$ is equal to the DC component of $I_{d2}$ therefore:

$$I_{d2} - \bar{I}_s = \hat{i}_{d2}.$$

Since $\hat{i}_{d1} = \hat{i}_{d2}$, then:

$$\hat{i}_{d2} = \frac{1}{(1+X)R} \hat{v}_{ab}.$$

The AC component of the gate to source voltage of the N-Channel FET $M_k$ is:

$$\hat{v}_{gsk} = \hat{i}_{d2} \times \frac{1}{sC_i}$$

where $s = \sqrt{-1} \times \omega$ ($\omega$ is $2\pi \cdot$ the frequency of $\hat{i}_{d2}$ expressed in radians).

Substituting for $\hat{i}_{d2}$:

$$\hat{v}_{gsk} = \frac{\hat{v}_{AB}}{sRC_i(1+X)}.$$

The N-channel FET must be biased such as to operate in the linear region of its operating characteristics $\hat{i}_{dk}$ is controllable by the voltage source $V_c$. Therefore $$\hat{i}_{dk} = \beta_k V_{dsk} \hat{v}_{gsk}$$

where $\hat{i}_{dk}$ is the drain current of the N-channel FET $M_k$;

$\beta_k$ is the transconductance factor of the N-channel FET $M_k$;

$V_{dsk}$ is the drain to source voltage of the N-channel FET $M_k$.

Since $$V_{dsk} = V_C - \bar{V}_{gs6} - \frac{\hat{i}_{dk}}{g_{m6}}$$

where $V_c$ is the voltage of the voltage source $V_c$;

$\bar{V}_{gs6}$ is the DC component of the gate source voltage of the N-Channel FET M6;

$g_{m6}$ is the small signal transconductance of the N-Channel FET M6.

Solving for $\hat{i}_{dk}$ $$\hat{i}_{dk} = \beta_k(V_c - \bar{V}_{gs6})V_{gsk} - \beta_k \frac{\hat{i}_{dk}}{g_{m6}} v_{gsk}$$

$$\hat{i}_{dk} \approx \beta_k(V_c - \bar{V}_{gs6})V_{gsk}.$$

The impedance $Z_{AB}$ as is present between the terminals A and B is defined as:

$$Z_{AB} = \frac{\hat{v}_{AB}}{\hat{i}_{dk}}$$

Substituting for $\bar{v}_{AB}$ and $\hat{i}_{dk}$ then $$Z_{AB} = \frac{sRC_i(1+X)}{\beta_k(\bar{V}_c + \bar{V}_{gs6})}.$$

Let $Z_{AB}$ be $$Z_{AB} = sL_{AB}$$

where $L_{AB}$ is the inductance as observed between terminals A and B.

Then $$L_{AB} = \frac{RC_i(1+X)}{\beta_k(\bar{V}_C + \bar{V}_{gs6})}.$$

The synthetic inductor of this invention has three sources of nonideality. These are:

1. The limited transconductance of the N-channel FET's which causes the voltage follower created by N-channel FET M6 of FIG. 4 to be nonideal creating the error term:

$$\beta_k \frac{\hat{i}_{dk}}{g_{m6}} v_{gsk}.$$

2. The input impedance $Z_{AB}$ is in parallel with $r_{dsk}$ that is the drain to source resistance of N-channel FET $M_K$ of FIG. 4.

3. The parasitic capacitance coupling with the circuit causes delay to the synthetic inductor and limits the bandwidth of the synthetic inductor.

The nonidealities impact the performance of the synthetic by creating a series resistor and limiting the bandwidth.

The synthetic inductor is for use as a small signal equivalent to a real inductor. The synthetic inductor is also polarized wherein the terminal A of FIG. 4 and FIG. 5 must be positive and the terminal B of FIG. 4 and FIG. 5 must be negative. If the circuit terminals are reversed, the circuit can not perform.

Additionally, the synthetic inductor requires a small DC bias current to operate. Referring to Fig 1B, a current source $I_{appl-bias}$ is added to the circuit of FIG. 1A to create the necessary bias for the synthetic inductor L.

P-channel FET $M_1$ is configured as a Metal Oxide Semiconductor diode such that a control current through the diode is the current flowing through the resistor R.

Figure 5:
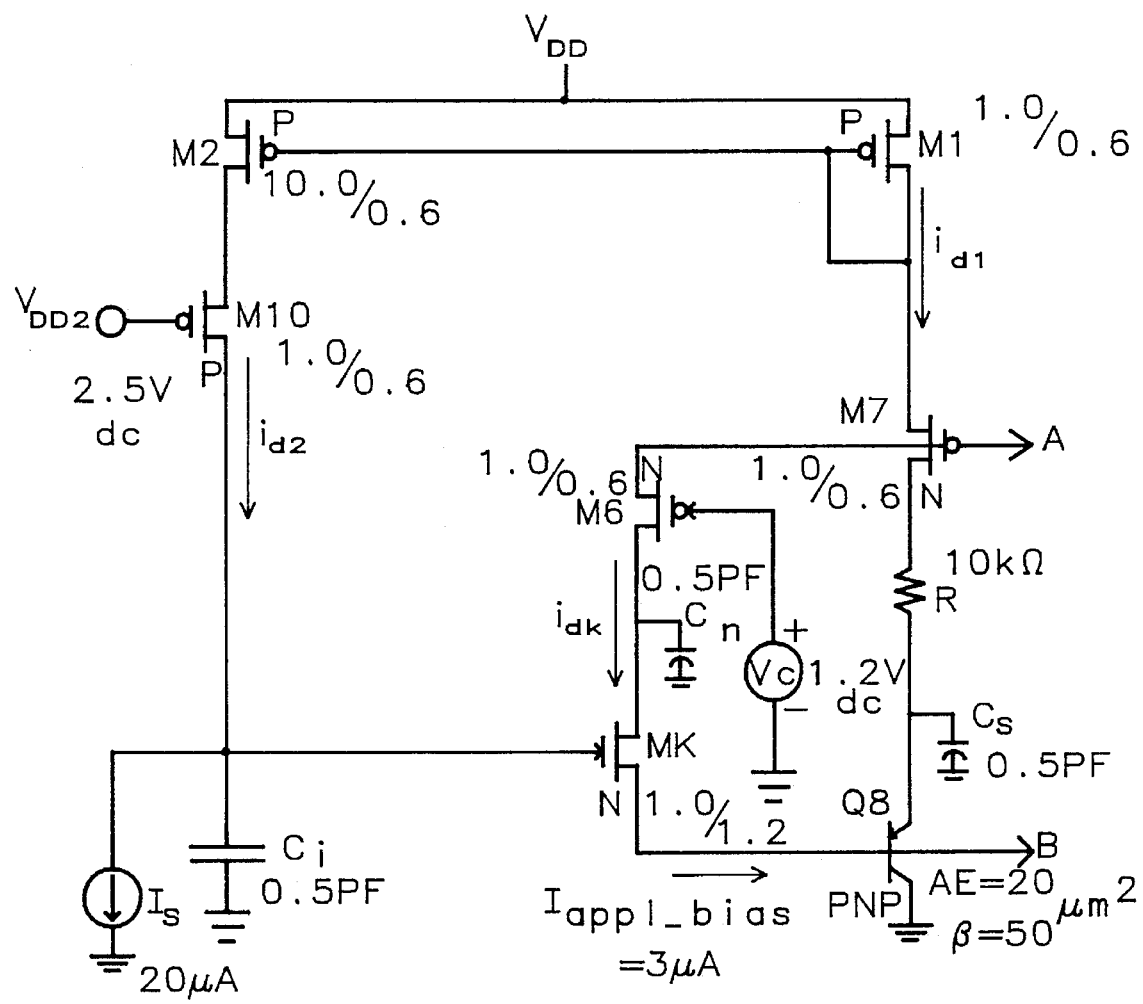
FIG. 5 is a modification of the preferred embodiment of this invention.

FIG. 5 is a schematic used for SPICE simulation, The P-channel FET M8 of FIG. 4 is replaced with a PNP bipolar junction transistor Q8 and other modifications have been made to enhance performance.

The P channel FET $M_{10}$ is added in FIG. 5 to suppress the coupling of AC noise with in the circuit and to create with P-channel FET M2 a better current source than shown in the circuit of FIG. 4.

The equation of the equivalent inductance is the same as in FIG. 4. That $$L = \frac{RC(1+X)}{\beta_k(V_C + V_{GS6})}$$

where now $$X = \frac{1}{g_{m7}R} + \frac{1}{g_{m8}R}$$

$g_{m7}$ is the transconductance of N-channel FET $M_7$ $g_{ms}$ is the transconductance of PNP bipolar junction transistor $Q_s$.

Capacitor $C_n$ and $C_s$ in FIG. 5 are added to the circuit of the synthetic inductor to make the voltage follower formed by N-channel FET $M_6$ and the voltage followers formed by N-channel FET $M_7$ and PNP bipolar junction transistor $Q_8$ resistant to coupling of AC noise.

Figure 6:
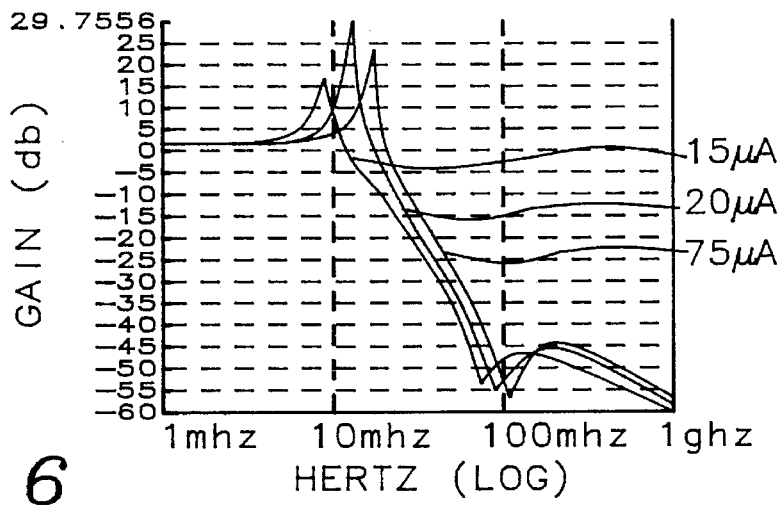
FIG. 6 is a logarithmic plot of the gain versus frequency of the embodiment shown in FIG. 5 with different values of the biasing current $I_s$.

FIG. 6 is a plot of the gain (db) $V^{at}/V_{in}$ of FIG. 1B versus the frequency wherein the circuit of FIG. 5 replaces the inductor L and series resistor R of FIG. 1B. The current bias of $I_s$ of FIG. 5 is varied from 15 µA to 20 µA to 25 µA. The change in the biasing current will control the inductance of the synthetic inductor and fine tune the frequency response of the network.

Figure 7:
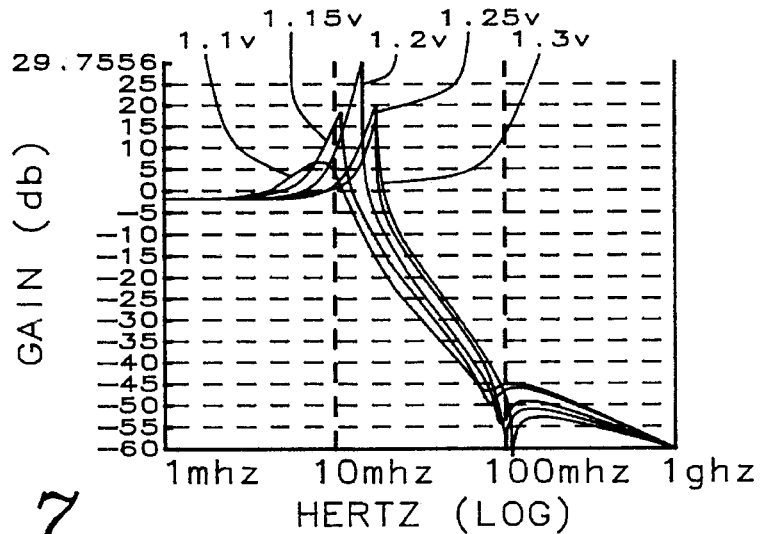
FIG. 7 is another logarithmic plot of gain versus frequency of the embodiment shown in FIG. 5 with different values of the voltage source $V_c$.

FIG. 7 is another plot of the gain (db) $V_{at}/V_{in}$ of FIG. 1B versus the frequency wherein the circuit of FIG. 5 replaces the inductor L and series resistor R of FIG. 1B. With this plot, the values of voltage source $V_c$ of FIG. 5 are varied from 1.1 V to 1.3 V in 0.05 V increments. The changes in the values of voltage source $V_c$ of FIG. 5 can be used change the frequency response of the synthetic inductor.

In standard integrated circuit process, the parameters of the process can not be controlled precisely. With the ability to add tuning and control circuitry, such as an auto tracking unit, the performance objectives of the synthetic inductor can be met.

Figure 2:
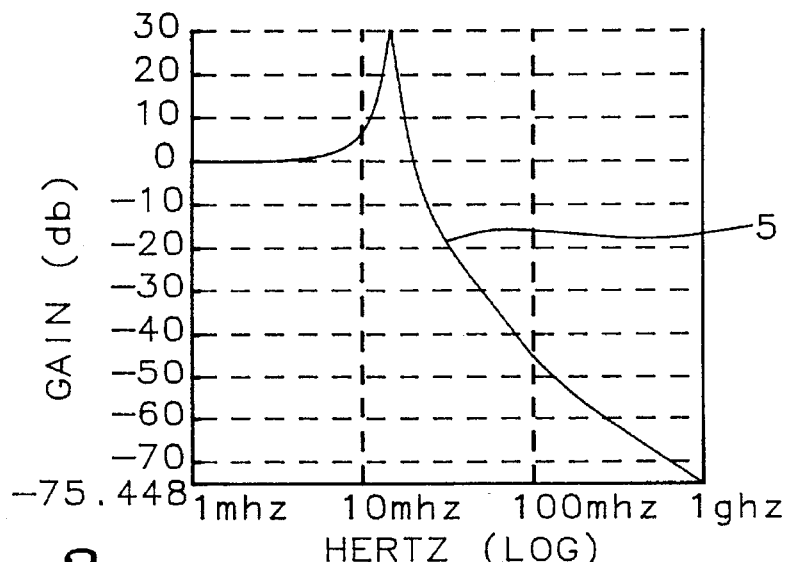
FIG. 2 is a logarithmic plot of the gain versus frequency of the circuit shown in FIG. 1.

Referring to FIG. 2, FIG. 6, and FIG. 7 together, the behavior of the synthetic inductor can be seen to be similar to that of ideal inductor L in series with a resistor R up to frequencies above 10 Mhz. This performance is achieved with a total current of less than 25 µA.

Figure 1A:
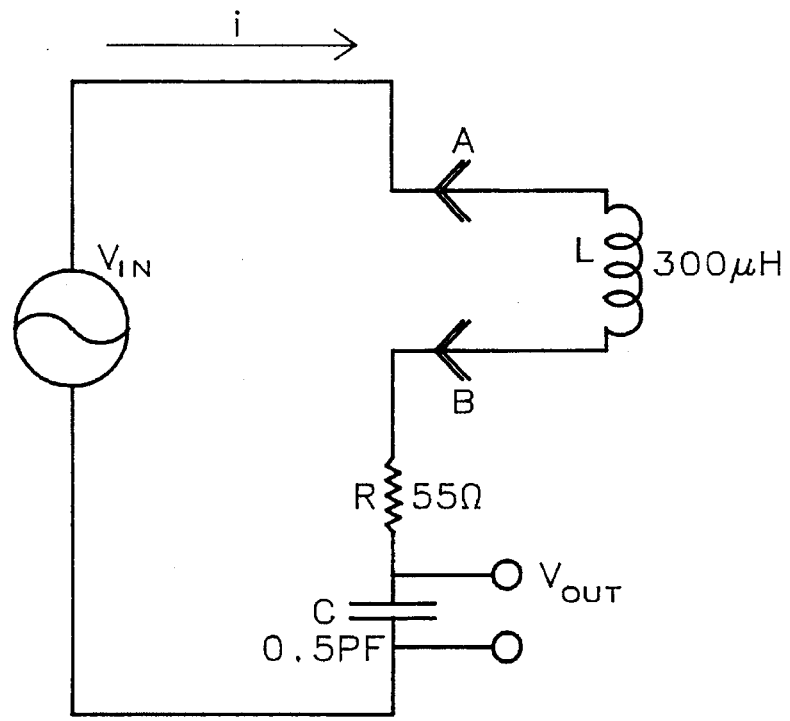
FIG. 1A a is schematic drawing of a simple RLC circuit.
Figure 1B:
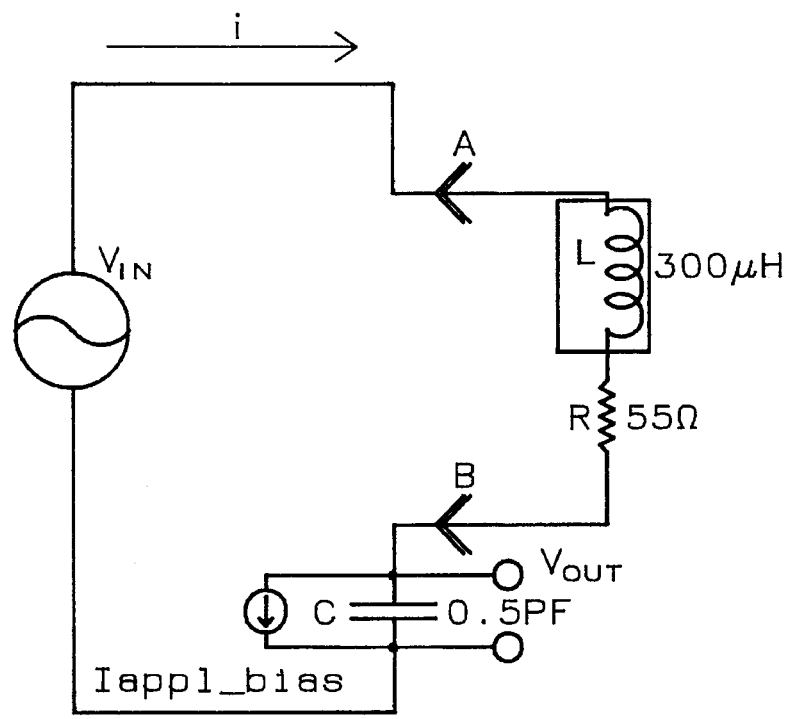
FIG. 1B is schematic drawing of an RLC circuit showing the connectivity for the synthetic inductor of this invention.
Figure 8A:
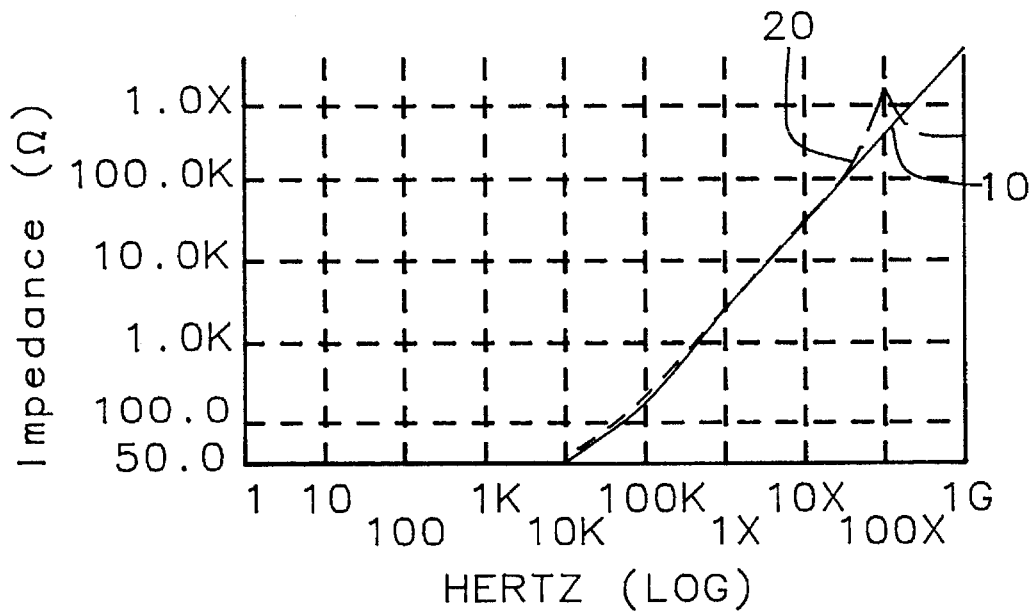
FIGS. 8A and 8B are a logarithmic plots of the equivalent impedance ($Z_{AB}$) versus frequency and the phase shift of the equivalent impedance ($\theta(Z_{AB})$) of the embodiment shown in FIG. 5 as compared with that of a ideal 300 μH inductor in series with a 55Ω, resistor.
Figure 8B:
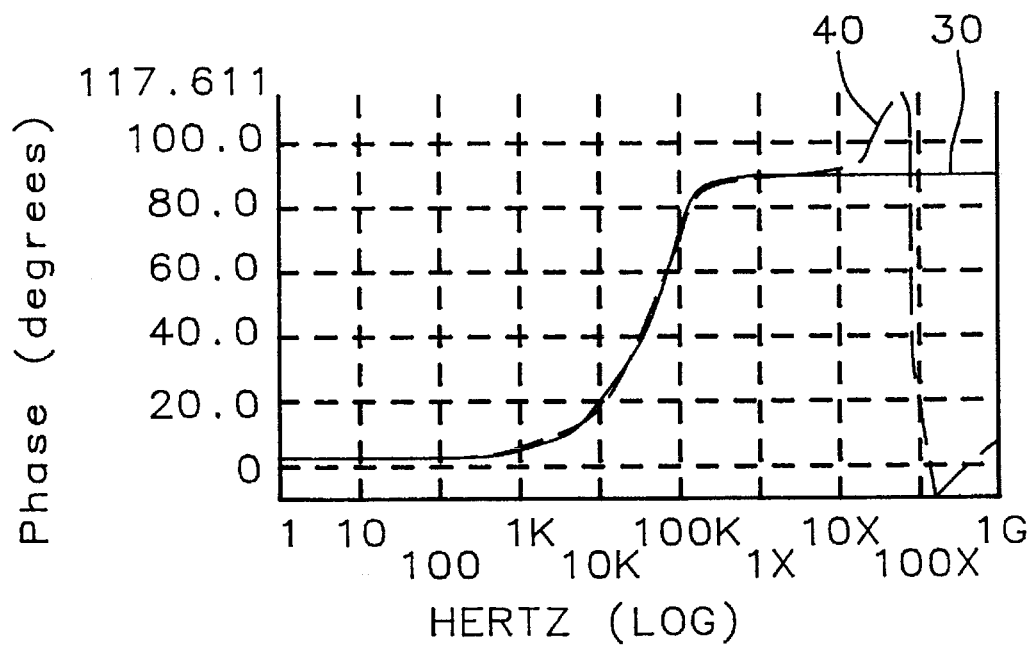

Referring to FIGS. 8A and 8B, the amplitude and phase shift of the equivalent impedance ($Z_{AB}$) of the synthetic inductor of FIG. 5 is compared to that of ideal inductor L in series with a resistor R of FIG. 1A. As can be seen in FIG. 8A, the amplitude 20 of impedance of the synthetic inductor matches the amplitude 10 of the ideal inductor until the operating frequency is above 10 Mhz. Referring to FIG. 8B, the phase shift 40 of the synthetic inductor is nearly identical to that of the ideal inductor until the frequency is beyond 10 Mhz. Improvements in integrated circuits processing will improve this frequency response to well beyond the 10 Mhz shown.

The values of components as specified in FIG. 1A, FIG. 1B, and FIG. 5 are for reference only and may be modified to effect changes in the performance of the synthetic inductor. Synthetic inductors can be fabricated with the embodiment of this invention have a range 100 µH to 100 mH with acceptable device geometries in current semiconductor process methods. Advances in semiconductor processing will improve performance and increase the bandwidth. Furthermore, any changes in semiconductor material types will not effect the operation of the circuit with appropriate changes in the design parameters.

While the invention has been particularly shown and described with reference to the preferred embodiments thereof, it will be understood by those skilled in the art that various changes in form and details may be made without departing from the spirit and scope of the invention.

What is claimed is:

1. An equivalent circuit for an inductor fabricated using integrated circuit devices, between a first circuit terminal and a second circuit terminal to perform a shifting of a phase delay of a signal voltage applied between the first and second circuit terminals, comprising:

a) a first buffer amplifier comprising a first input terminal coupled to the first circuit terminal and a first output terminal, wherein a voltage at the first output terminal is equal in magnitude of the voltage at the first input terminal;

b) a second buffer amplifier comprising a second input terminal coupled to the second circuit terminal and a second output terminal, wherein a voltage at the second output terminal is equal in magnitude of the voltage at the second input terminal;

c) a resistor means coupled between the first output terminal and the second output terminal wherein a current through the resistor means is equal to the voltage applied between the first and second circuit terminals divided by the resistance of the resistor means;

d) a current controlled current source wherein a control current is the current through the resistor means and the current source current is the control current multiplied by a multiplier factor;

e) a capacitance means coupled to the current controlled current source wherein a voltage developed across, the capacitance means is the current source current divided by the capacitance of the capacitance means multiplied by $\sqrt{-1}$ multiplied by the angular frequency of the signal voltage at the first and second circuit terminals;

f) a voltage controlled resistor comprising a top terminal, a bottom terminal, coupled to the second circuit terminal, and a control terminal coupled to the capacitance means and the current controlled current source, wherein a value of resistance between the top terminal and the bottom terminal is 1 divided by a constant gain factor times the voltage developed across the capacitance means; and g) a biasing means coupled between the first circuit terminal and the top terminal of the voltage controlled resistor to provide a constant voltage to the top terminal so that a current through the voltage controlled resistor is the constant voltage divided by the value of the resistance of the voltage controlled resistor and an impedance between the first and second circuit terminals is the signal voltage applied between the first and second circuit terminals divided by the current through the voltage controlled resistor.

2. The circuit of claim 1 wherein the first buffer amplifier comprises a first N-channel FET wherein the gate is connected to the first input terminal and the source is connected to the first output terminal.

3. The circuit of claim 1 wherein the second buffer amplifier comprises a first P-channel FET wherein the gate is connected to the second input terminal and the source is connected to the second output terminal.

4. The circuit of claim 1 wherein the current controlled current source comprises:

a) a second P-channel FET configured as a Metal Oxide Semiconductor diode connected to the drain of the first N-channel FET so that the current from the drain to the source of said second P-channel FET is the current through the resistor means; and b) a third P-channel FET configured with the second P-channel FET as a current mirror wherein the current from the drain to the source is proportional to the current through the resistor means.

5. The circuit of claim 1 wherein the voltage controlled resistor is a second N-channel FET with its drain being the top terminal, the gate being the control terminal, and its source being the bottom terminal.

6. The circuit of claim 1 wherein the biasing means comprises:

a) a third N-channel FET with its drain connected to the first circuit terminal, and its source connected to the top terminal of the voltage controlled resistor;

b) a voltage source connected to the gate of the third N-channel FET.

7. The circuit of claim 1 wherein the inductance as measured between the first and second circuit terminals is equal to $$\frac{RC\left(1+\frac{1}{Rgm_{M1N}}+\frac{1}{Rgm_{M3P}}\right)}{\beta_K(V_C-\overline{V}_{gs})}$$

where

R is the value of the resistor means;

C is the value of the capacitance means;

$\beta_k$ the transconductance factor of the second N-channel FET;

$V_c$ is the magnitude of the voltage source;

$\overline{V}_{gs}$ is the magnitude of the voltage developed from the gate to the source of the third N-channel FET;

$gm_{M1N}$ is the transconductance of the first N-channel FET; and $gm_{M3P}$ is the transconductance of the first P-channel FET.

8. A synthetic inductor circuit, fabricated using standard integrated circuit processing methods, coupled between a first inductor terminal and second inductor terminal, to perform a shifting of a phase delay of a signal voltage applied between said first and second inductor terminals, comprising:

a) a first buffer amplifier comprising a first N-channel FET wherein the gate of said first N-channel FET is connected to the first inductor terminal;

b) a second buffer amplifier comprising a first P-channel FET wherein the gate of said first P-channel FET is connected to the second inductor terminal;

c) a resistor means coupled between the source of the first N-channel FET and the source of the first P-channel FET, such that the value of the current flowing through said resistor means is equal to the signal voltage applied between the first and second inductance terminals less the voltages developed from the gates to the sources of the first N-channel FET and first P-channel FET divided by the resistance of the resistor means;

d) a current controlled current source comprising a second P-channel FET configured as a Metal Oxide Semiconductor diode connected to the drain of the first N-channel FET such that a control current through the Metal Oxide Semiconductor diode is the current flowing through the resistor means, and a third P-channel FET, configured as a current mirror such that a current source current through said third P-channel FET is the control current multiplied by a multiplier factor;

e) a capacitance means coupled to the current controlled current source wherein a voltage developed across the capacitance means is the current source current divided by the capacitance of the capacitance means multiplied by $\sqrt{-1}$ multiplied by the angular frequency of the signal voltage at the first and second inductor terminals;

f) a second N-channel FET configured as a voltage controlled resistor, wherein the source of said second N-channel FET is connected to the second inductor terminal, and the gate of said second N-channel FET is connected to the drain of the third P-channel FET and the capacitance means such that the resistance of the voltage controlled resistor, as measured between the drain and the source of said second N-channel FET, is 1 divided by a constant gain factor multiplied by the voltage developed across the capacitance means; and g) a biasing means, comprising a third N-channel FET and a voltage source connected to the gate of said third N-channel FET, wherein the first inductor terminal is connected to the drain of said third N-channel FET and the drain of the second N-channel FET is connected to the source of said second N-channel FET to provide a constant voltage to the drain of the second N-channel FET, such that a current through the voltage controlled resistor is the constant voltage divided by the resistance of the voltage controlled resistor and an impedance between the first and second inductor terminals is the signal voltage applied by between the first and second inductor terminals divided by the current through the voltage controlled resistor.

9. The circuit of claim 8 wherein the inductance as measured between the first and second inductor terminals is equal to $$\frac{RC\left(1+\frac{1}{Rgm_{M1N}}+\frac{1}{Rgm_{M3P}}\right)}{\beta_K(V_C-\overline{V}_{gs})}$$

where

R is the value of the resistor means;

C is the value of the capacitance means;

$\beta_k$ is the transconductance factor of the second N-channel FET;

$V_c$ is the magnitude of the voltage source;

$\overline{V}_{gs}$ is the magnitude of the voltage developed from the gate to the source of the third N-channel FET;

$gm_{M1N}$ is the transconductance of the first N-channel FET; and $gm_{M3P}$ is the transconductance of the first P-channel FET.

10. An equivalent circuit for an inductor, fabricated using standard integrated circuit processing methods, coupled between a first inductance terminal and second inductance terminal, to perform a shifting of a phase delay of a signal voltage applied between said first and second inductance terminals, comprising:

a) a first buffer amplifier comprising a first input terminal coupled to the first inductance terminal and a first output terminal, wherein a voltage at the first output terminal is equal in magnitude of the voltage at the first input terminal;

b) a second buffer amplifier comprising a PNP bipolar junction transistor wherein the base of said PNP bipolar junction transistor is connected to the second inductance terminal and the emitter of said PNP bipolar junction transistor is a second output terminal;

c) a resistor means coupled between the first output terminal and the second output terminal wherein a current through the resistor means is equal to the voltage applied between the first and second inductance terminals divided by the resistance of the resistor means;

d) a current controlled current source comprising a first P-channel FET configured as a Metal Oxide Semiconductor diode connected to the drain of the first N-channel FET such that a control current through the Metal Oxide Semiconductor diode is the current flowing through the resistor means, and a second P-channel FET and a third P-channel FET, configured as a current mirror such that a current source current through said third P-channel FET is the control current multiplied by a multiplier factor;

e) a capacitance means coupled to the current controlled current source wherein a voltage developed across the capacitance means is the current source current divided by the capacitance of the capacitance means multiplied by $\sqrt{-1}$ multiplied by the angular frequency of the signal voltage at the first and second inductance terminals;

f) a voltage controlled resistor comprising a top terminal, a bottom terminal, coupled to the second inductance terminal, and a control terminal coupled to the capacitance means and the current controlled current source, wherein a value of resistance between the top terminal and the bottom terminal is 1 divided by a constant gain factor times the voltage developed across the capacitance means; and g) a biasing means coupled between the first inductance terminal and the top terminal of the voltage controlled resistor to provide a constant voltage to the top terminal so that a current through the voltage controlled resistor is the constant voltage divided by the value of the resistance of the voltage controlled resistor and an impedance between the first and second inductance terminals is the signal voltage applied between the first and second inductance terminals divided by the current through the voltage controlled resistor.

11. The circuit of claim 10 further comprising a second capacitance means, connected to the top terminal of the voltage controlled resistor, and a third capacitance means, connected to the second output terminal, to suppress any circuit noise and reduce any nonideality introduced by the integrated circuit processing.

12. The circuit of claim 10 wherein the first buffer amplifier comprises a first N-channel FET wherein the gate is connected to the first input terminal and the source is connected to the first output terminal.

13. The circuit of claim 10 wherein the voltage controlled resistor is a second N-channel FET with its drain being the top terminal, the gate being the control terminal, and its source being the bottom terminal.

14. The circuit of claim 10 wherein the biasing means comprises:

a) a third N-channel FET with its drain connected to the first circuit terminal, and its source connected to the top terminal of the voltage controlled resistor;

b) a voltage source connected to the gate of the third N-channel FET.

15. The circuit of claim 10 wherein the inductance as measured between the first and second circuit terminals is equal to $$\frac{RC\left(1+\frac{1}{Rgm_{M1N}}+\frac{1}{Rgm_{M3P}}\right)}{\beta_K(V_C-\overline{V}_{gs})}$$

where

R is the value of the resistor means;

C is the value of the capacitance means;

$\beta_k$ is the transconductance factor of the second N-channel FET;

$V_c$ is the magnitude of the voltage source;

$\overline{V}_{gs}$ is the magnitude of the voltage developed from the gate to the source of the third N-channel FET;

$gm_{M1N}$ is the transconductance of the first N-channel FET; and $gm_{M3P}$ is the transconductance of the first P-channel FET.

\* \* \* \* \*

UNITED STATES PATENT AND TRADEMARK OFFICE
CERTIFICATE OF CORRECTION

PATENT NO. : 5,600,288
DATED : February 4, 1997
INVENTOR(S) : Jing-Meng Liu

It is certified that error appears in the above-indentified patent and that said Letters Patent is hereby corrected as shown below:

On the title page, correct the (73) Assignee from "Tainan Semiconductor Manufacturing Company, Ltd. to --Taiwan Semiconductor Manufacturing Company, Ltd--.

Signed and Sealed this

Fifteenth Day of April, 1997

Attest:

BRUCE LEHMAN

*Attesting Officer*     *Commissioner of Patents and Trademarks*